Nov. 29, 1960 G. R. P. MARIÉ 2,962,676

ULTRA-HIGH FREQUENCY GYROMAGNETIC FREQUENCY CHANGER

Filed Jan. 14, 1958 4 Sheets-Sheet 2

ULTRA-HIGH FREQUENCY GYROMAGNETIC FREQUENCY CHANGER

Filed Jan. 14, 1958 4 Sheets-Sheet 3

Nov. 29, 1960 G. R. P. MARIÉ 2,962,676

ULTRA-HIGH FREQUENCY GYROMAGNETIC FREQUENCY CHANGER

Filed Jan. 14, 1958 4 Sheets-Sheet 4

United States Patent Office 2,962,676

Patented Nov. 29, 1960

2,962,676

ULTRA-HIGH FREQUENCY GYROMAGNETIC FREQUENCY CHANGER

Georges Robert Pierre Marié, 16 Rue de Varize, Paris 16, France

Filed Jan. 14, 1958, Ser. No. 708,936

Claims priority, application France Jan. 26, 1957

4 Claims. (Cl. 332—51)

The present invention relates to frequency changing devices for ultra-high frequency electromagnetic waves having frequencies in the range of several thousands of megacycles per second. More specifically, it relates to such devices in which a signal current of frequency $f_1$ and a local oscillator of frequency $f_2$ feed two electric circuits both magnetically coupled to a body of magnetic material, such as a ferromagnetic ferrite, polarized by a steady magnetic field having an intensity $H_0$ and displaying a gyromagnetic effect at a frequency $f_0$ depending on $H_0$, while an output frequency signal with a modified frequency $f_3$ is received in an output electric circuit also coupled to the said magnetic body.

To simplify the language, it will be assumed hereinafter that the magnetic material used in the device of the invention is a ferromagnetic ferrite, but it should be understood that other materials endowed with suitable magnetic properties, in particular certain paramagnetic materials, could also be employed.

To give a clear description of the subject matter, it will be assumed that the output signal frequency $f_3$ equals $(f_1-f_2)$. As this frequency is much lower than $f_1$ and $f_2$, output signals at frequency $f_3$ are much more easily amplified than ultra-high frequency signals could be. Moreover, it results from both theory and experience that the choice of $(f_1-f_2)$ as the modified frequency at the output of the frequency changing device of the invention also corresponds to the highest possible signal transfer efficiency. Other frequency changes at different frequencies could also be obtained, but at the price of a much lower efficiency.

The frequency changing device of the invention, compared with those of the previous art for the same purpose, has the advantage that, as it does not include elements having a noticeable ohmic resistance or semiconductor elements, the very existence of which implies that of potential barriers, it does not introduce any background noise of its own, or a threshold of sensitivity, and thus allows receiving of very weak signals.

Still another advantage of the device of the invention is that, provided the magnetic field of the local oscillator is strong enough, a noticeable power gain of the output signal compared with the input signal, together with the required frequency change, is obtained.

The theory of the gyromagnetic effect has been explained in detail in a paper by D. Polder, published in the January 1949 issue of the review "Philosophical Magazine," vol. 40, pp. 99–114 and also in a paper by C. L. Hogan published in the January 1952 issue of the review "Bell System Technical Journal," vol. 31, pp. 1–31.

It will only be reminded here that the gyromagnetic resonance frequency $f_0$ is practically given, for all ferromagnetic materials, by the formula:

$$f_0=2.8H_0$$

where $f_0$ is expressed in megacycles per second and $H_0$ in oersteds. Designating the corresponding angular frequency by $\omega_0$, the value of $\omega_0$ equals $(\gamma H_0)$ radians per second, with the quantity $\gamma$, called "gyromagnetic ratio," equal to $5.6\pi 10^6$.

When a steady magnetic field $H_0$ of fixed intensity and direction and one or several alternating magnetic fields variable in time are simultaneously applied to a magnetic body, the motion of the corresponding magnetization vector, the direction of which coincides in the absence of the latter variable fields with that of the field $H_0$, is determined by a vector relationship (see C. L. Hogan, loc. cit., p. 27) between the time derivative of this vector and the vector sum of the various applied magnetic fields. This relationship involves the above-mentioned gyromagnetic ratio and another constant, which is a damping factor depending on the nature of the magnetic material and closely associated with its internal losses. More precisely, this factor depends on what is called the relaxation time of the magnetic moments of the considered magnetic body.

A study of this relationship shows that the modulus of the magnetization vector is a constant one and that its value only depends on that of the steady magnetic field $H_0$. It is only its direction which changes. It is known that when the applied alternating field is a sinusoidal field at a fixed frequency $f_2$, the magnetization vector effects a simple motion around the direction of $H_0$, called "precession" motion, describing a cone with an elliptic cross-section; this cross-section becomes practically circular when $f_2$ is sufficiently near to the gyromagnetic resonance frequency $f_0$. When the total field contains two or several components of different frequencies, this vector effects a more complex motion, simultaneously comprising the above-mentioned precession motion and a nutation motion, i.e., a motion in which the angle formed by the vector with the direction of $H_0$ varies in time.

The devices of the present invention systematically make use of this nutation motion for the production in the magnetic body of an alternating magnetic induction vector having in a certain direction a component with a frequency equal to $(f_1 \pm f_2)$, when alternating magnetic fields with respective frequencies $f_1$ and $f_2$ are simultaneously applied to this body in two other directions.

More precisely, the devices of the invention take advantage of the existence, in this nutation motion, of a natural oscillation frequency, which depends on the intensities of both of the applied steady and local oscillator fields. The method of calculation of this natural frequency will be explained later on. For the present time, it will only be mentioned that the most favorable results are obtained when, by an appropriate choice of both above-mentioned field intensities, this natural frequency is made to coincide with frequency $f_3$ or very near thereto. However, this can only be achieved through a very careful adjustment of both said intensities.

According to the present invention, a frequency changing device for ultra-high frequencies is provided, comprising at least one body of magnetic material having gyromagnetic resonance at a frequency $f_0$ when polarized by a steady magnetic field $H_0$, means for applying said steady field $H_0$ to said body in a first given direction, a first input circuit means submitted to the action of a signal current of frequency $f_1$, means for deriving from said first circuit a first alternating magnetic field of frequency $f_1$ and for applying it to at least part of said magnetic body in a second direction substantially perpendicular to said first direction, second circuit means for deriving from a local oscillator a second alternating magnetic field of frequency $f_2$ and for applying it to at least part of said magnetic body in a third direction substantially perpendicular to said first direction, and means for impressing the total resulting magnetic field in said first direction upon an output circuit so as to create therein an alternating electromotive force of frequency $f_3$ equal to $(f_1 \pm f_2)$.

According to a preferred embodiment of the invention, the device of the invention uses two groups of magnetic material bodies symmetrically arranged with respect to a plane parallel to the direction of the permanent field $H_0$, and the means serving to produce the magnetic fields with respective frequencies $f_1$ and $f_2$ are arranged in such a way that one of these fields is symmetrical with respect to said plane while the other is anti-symmetrical with respect to the same plane.

According to an advantageous embodiment of the invention, both frequencies $f_1$ and $f_2$ are near to the gyromagnetic resonance frequency $f_0$, and the value of the frequency difference $(f_2 - f_0)$ is selected according to a rule which will be given later on.

In the latter embodiment, frequency $f_3$ is equal to $(f_1 - f_2)$ and consequently much lower than any one of frequencies $f_1$ and $f_2$. In this case, the means used for the coupling of the device to its output circuit essentially consists of a conducting loop or winding, the plane of which is perpendicular to the above-mentioned first direction. This winding or loop is connected with an external working circuit adapted to signals of frequency $f_3$. As the latter frequency is relatively low, subsequent amplification of the output signals can easily be effected by conventional means.

According to a variant of this embodiment of the invention, the production means of the alternating magnetic fields of frequencies $f_1$ and $f_2$ essentially include a resonant cavity with a frequency very near to $f_0$.

Other particularities and embodiment examples of the invention will be better understood from the following detailed description and from the appended drawings, in which.

Figure 1:
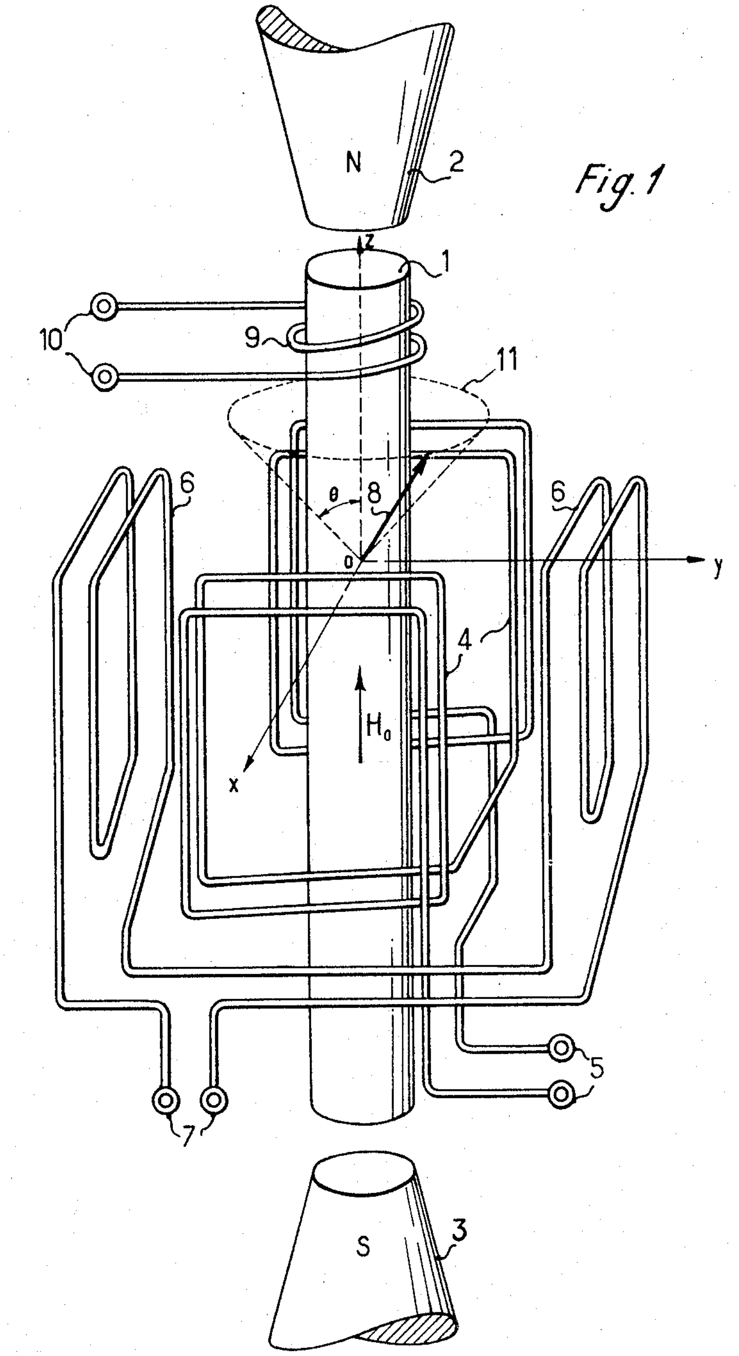
Fig. 1 is a simplified and very schematic diagram illustrating the principle of the operation of the device of the invention.

Referring to Fig. 1, a cylindrical ferrite body is referred to a tri-rectangular coordinate system O$xyz$, the axis O$z$ of which is that of the cylinder. The poles 2 and 3 of a magnet, the body of which is not shown on the drawing, create a uniform magnetic field with an intensity $H_0$.

The signal current of frequency $f_1$ is applied to the input circuit consisting of coil 4 through terminals 5, which results in a magnetic field directed along O$x$ and the instantaneous value of which is supposed to be equal to $(h_1 \cos \varpi_1 t)$, $\varpi_1$ being equal to $2\pi$ times the frequency $f_1$, and $t$ denoting time.

The wave issuing from the local oscillator is applied to a second circuit consisting of coil 6 through terminals 7, which creates a magnetic field directed along O$y$ and the instantaneous value of which is supposed to be equal to $(h_2 \cos \varpi_2 t)$, where $\varpi_2$ is equal to $2\pi$ times the frequency $f_2$.

In the direction O$z$ thus appears an alternating magnetic field of frequency $(f_1 \pm f_2)$ which causes an electromotive force in coil 9, which, with its terminals 10, constitutes the output circuit of the apparatus.

A simplified explanation of the practically found frequency changing effect can be given by considering the total field resulting from the two applied alternating fields. Assuming $h_1$ to be small compared with to $h_2$, the effect of $h_1$ is to produce a periodical amplitude variation at the frequency $(f_1 - f_2)$ in the amplitude of the resulting field, as the relative phase of the two fields changes at a frequency equal to $(f_1 - f_2)$.

The magnetization intensity at a point of cylinder 1 is shown on Fig. 1 as vector 8. Under the effect of the steady magnetic field $H_0$ directed along O$z$ and of the applied alternating fields, this vector 8 takes a precession motion. Supposing that the intensity of $H_0$ is so chosen that the angular precession velocity corresponding to the gyromagnetic resonance be very near to $\varpi_2$, the end of vector 8 turns on the circle 11 of axis O$z$, represented in dotted line on the drawing.

The nutation angle $\theta$ is defined as the angle between vector 8 and axis O$z$; this angle depends on the intensity of the total alternating magnetic field applied. As this intensity is that of the above-mentioned field, it changes periodically at the frequency $(f_1 - f_2)$ and the angle $\theta$ changes accordingly.

The magnetic induction flux in coil 9 therefore changes with the magnitude of the magnetization component in the direction O$z$, i.e. proportionally to $\cos \theta$. As $\theta$ periodically changes at the angular frequency $(f_1 - f_2)$, this magnetic flux varies and an alternating voltage of frequency $(f_1 - f_2)$ is received at terminals 10.

The complete theory of the phenomena is, of course, much more complicated. Only its main results will be given here. It can be shown that the electromotive force in coil 9 of Fig. 1 is the sum of various components, the two most important of which have respective frequencies $(f_1 - f_2)$ and $(f_1 + f_2)$. The amplitude of the various components are proportional to the amplitude $h_1$ of the signal field and increase when the amplitude $h_2$ of the field of the local oscillator itself increases. The latter amplitude is practically proportional to the square root of the power delivered by said oscillator and dissipated as losses in the magnetic body.

When a high oscillator power is employed, i.e. if $h_2$ is large, a significant power gain may be obtained in the transfer of the signal from the input to the output circuit. Therefore, if a very high oscillator power is not available, the losses in the magnetic material should be very low. It can also be shown that, other things be equal, it is advantageous to use a magnetic material with a high saturation induction.

The arrangement shown on Fig. 1 is purely schematic and is shown only for the purpose of explaining the operation of the device of the invention. In fact, as the invention is mainly concerned with the technique of ultra-high frequencies, it is practically impossible to use coils such as shown at 4, 6 and 9 on Fig. 1; the circuits which replace these coils should actually be constructed in the form of coaxial lines, wave guides, resonant cavities and, in general, of suitable circuit elements for the ultra-short wave technique.

Such examples of practical embodiments of the invention will now be described in greater detail. All hereinafter described examples include the above-mentioned feature, according to which one of the magnetic fields of frequencies $f_1$ and $f_2$ is symmetrical with respect to a plane of symmetry of the apparatus, while the other is antisymmetrical with respect to the same plane. The object of this arrangement is mainly to avoid direct transmission of ultra-high frequency energy from the oscillator to the signal's input circuit.

Figure 2:
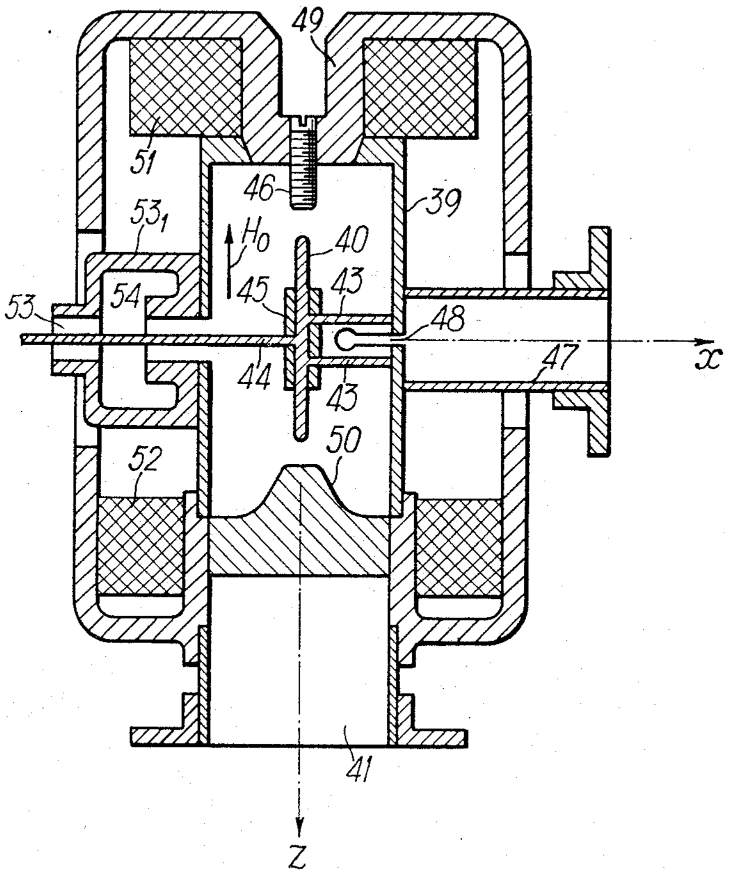
Figs. 2, 3, 4 and 5 show various practical embodiments of the invention.
Figure 3:
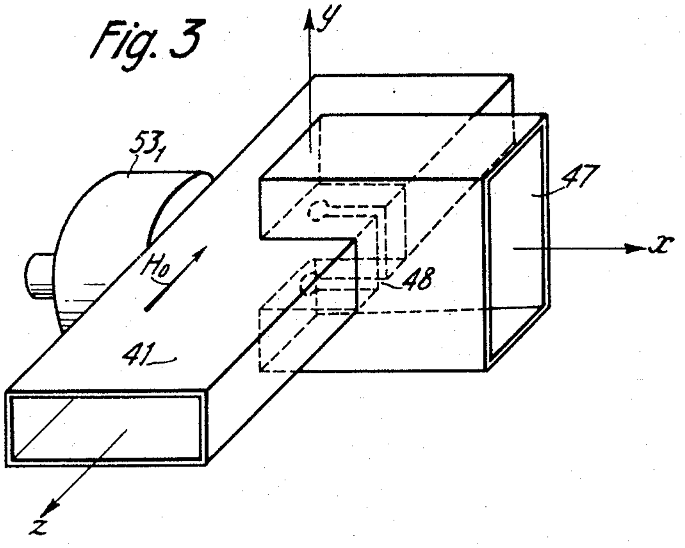
Figure 4:
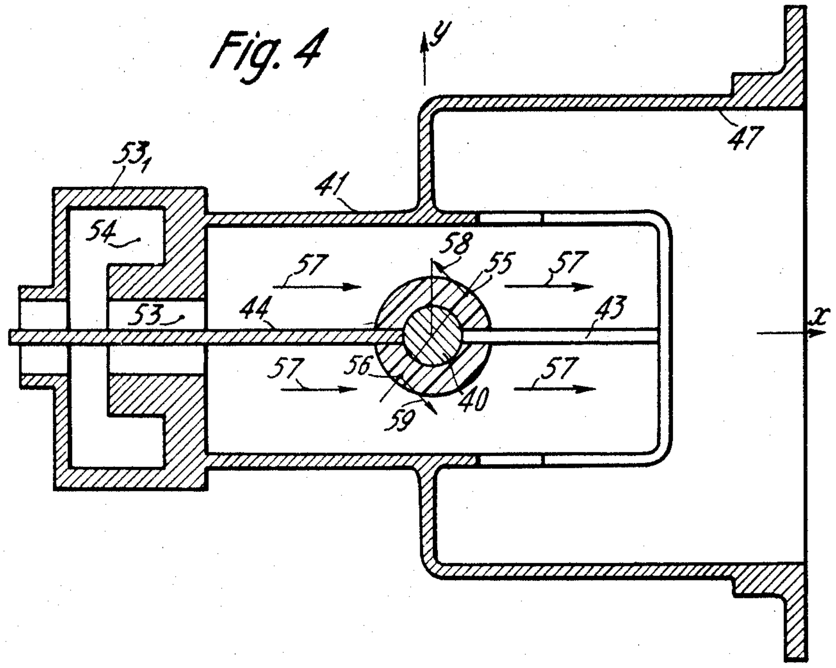

In the device of Figs. 2 to 4, a conducting rod 40, surrounded by a cylindrical ferrite sleeve 45, is located near to the end of wave guide 41 into which the received high frequency signal enters. This conducting rod, preferably a metallic rod slightly shorter than half the wavelength corresponding to the oscillator frequency $f_2$, the oscillation of which enters through guide 47, energizes 40 through the slot 48 provided in the guide wall 39 and the pair of rods 43, 43, welded to the walls of 41 near to the edge of slot 48, which also mechanically support the assembly 40—45.

The adjustable screw 46 which passes through the guide terminal wall 49 allows to easily adjust to frequency $f_2$ the coaxial line member consisting of rod 40 combined with the surrounding wall of guide 41 and to tune it to the frequency of the local oscillation entering slot 48; this also allows adjustment of the oscillator power supplied to the system.

The electromotive force of frequency $(f_1 - f_2)$ is received in a wire 44 secured to the conducting rod 40 and constituting the central conductor of an output coaxial line 53, the outer conductor of which consists of the walls of 41 and member $53_1$. As shown in Fig. 2, member $53_1$ is provided with a slot 54 constituting an antiresonant element, the purpose of which is to prevent oscillator wave propagation towards 53.

Fig. 3 shows, in a more detailed manner, how guides 41 and 47 are interconnected through the slot 48.

The ferrite sleeve 45 surrounds rod 40 only in the part of its length where the current generated by the local oscillator has its maximum value. This current develops a high frequency alternating magnetic field the force lines of which surround rod 40 and so develop a maximum field in the sleeve, as the sleeve has a very low magnetic reluctance.

A permanent magnetic field $H_0$ parallel to the axis of rod 40 is provided between two pole-pieces, one of which 49 is located at the end of guide 41, while the other 50 (Fig. 2), is constituted by a plate of ferromagnetic material, the faces of which are perpendicular to the electric field of the $TE_{10}$ waves which propagate in guide 41. By means of one or several plates thus arranged, it is possible to build a pole-piece, which for the given wave configuration does not appreciably disturb the transmission of ultra-high frequency signals propagating in 41.

The intensity of the permanent magnetic field depends on that of the D.C. current in coils 51 and 52 of the magnetic polarization circuit. This intensity is so adjusted that the gyromagnetic resonance of the material of sleeve 45 takes place at a frequency near to that of the local oscillator. Under these conditions, the magnetization vector 8 (Fig. 1) assumes a precession motion along a conical surface of practically circular cross-section with an axis parallel to $z$, with a nutation angle kept as large as possible by the oscillator field of frequency $f_2$ entering guide 47. In Fig. 4 there are shown, at points 55 and 56 of a diameter of sleeve 45, the projections 58 and 59 on the $(yz)$ plane of the magnetic fields created by the local oscillation current flowing in rod 40. These projections are symmetrical with respect to the axis of 40, since the magnetic field $H_0$ and the magnetic field of the local oscillator have a circular symmetry with respect to said axis.

The received signal enters, as already mentioned, in the form of a $TE_{10}$ wave through the rectangular guide 41. Its magnetic field in the vicinity of the guide axis is transversal and parallel to the longer sides of the guide. It is indicated by the arrows 57 in Fig. 4. Its effect is obviously to disturb the precession motion maintained by the local oscillation for the magnetization vector in the ferrite.

It must be mentioned that, taking into account that the field due to the received signal is uniform in first approximation, while the precession motion of the magnetization vector has a circular symmetry around the axis of 40, the effect of field 57 at point 55 on this vector tends to accelerate the precession motion, while the effect of field 57 at point 56 tends, on the contrary, to decelerate it. Owing to the gyromagnetic effect, the nutation angle increases when the precession motion is accelerated and decreases when it is decelerated. It results therefrom that when the magnetization vector component parallel to the axis of rod 40 decreases in the part of the ferrite sleeve 45 which is on the side of the positive $y$'s, it increases in the part which is on the side of the negative $y$'s and conversely. Alternating magnetic induction fluxes of frequency $(f_1-f_2)$ or $(f_1+f_2)$ are so produced with opposite phases on etiher side of the inner conductor 44 of the output coaxial line 53, which transmits a corresponding electromotive force to a utilization apparatus.

Of course, in the device which has just been described in connection with Figs. 2 to 4, the respective parts of the oscillator and signal fields may be interchanged. For instance, in the device of Fig. 2, the signal wave can be led to the resonant cavity through guide 41.

In the device of Figs. 2 to 4, the leading-in guides could also be replaced by coaxial lines terminated by suitable magnetic coupling loops.

Figure 5:
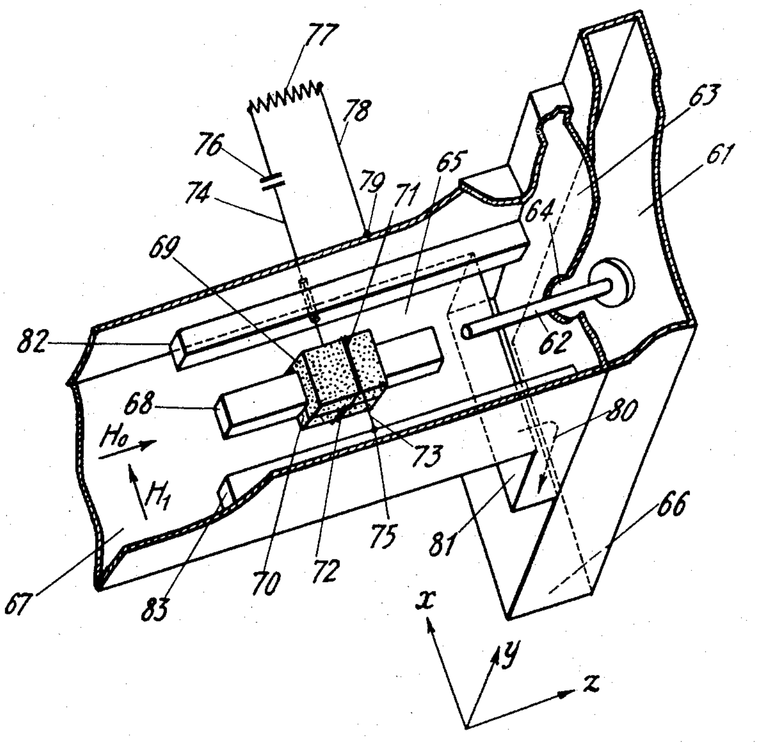

Fig. 5 is a perspective view of a particularly advantageous embodiment of the invention.

In the device of Fig. 5, the local oscillator wave is transmitted through a rectangular cross-section wave guide 61, through which it propagates as a $TE_{10}$ wave, i.e. a wave electrically polarized in a direction perpendicular to the broader walls of the guide. Guide 61 is connected to a conducting rod 62 which passes through a wall of said guide through aperture 64. The function of rod 62 is to energize the resonant cavity 65. The length of this rod is very near to a quarter of the free-space wavelength for frequency $f_2$.

To obtain maximum energy transfer from the local oscillator to rod 62 and cavity 65, guide 61 is terminated at 66 by a conducting wall, the distance of which to 62 is chosen near to a quarter of the phase wavelength in said guide for frequency $f_2$. In guide 61, the propagation direction of the wave from the local oscillator is parallel to the axis $y$ of the tri-rectangular reference axis system $(x, y, z)$ shown at the lower part of the figure. By adjusting the position of 66, it is also possible to adjust the amplitude of the latter wave.

The magnetic field lines of the local oscillator wave turn around 62 and thus have, with respect to a plane parallel to $(yz)$ and containing the axis of 62, an antisymmetrical configuration.

The signal wave enters through guide 67 into cavity 65, which constitutes the terminal part of said guide. In guide 67, the latter wave propagates according to a $TE_{10}$ mode electrically polarized in a direction parallel to $y$. Its magnetic field $H_1$ is parallel to axis $x$ and thus perpendicular to the narrower walls of guide 67, and consequently has a symmetrical configuration with respect to the just mentioned plane.

In part 65, a second conducting rod 68 is arranged along the guide axis parallel to axis $z$. Rod 68 is surrounded by an assembly of two ferromagnetic ferrite pieces 69 and 70, which are themselves surrounded by thin metallic wire windings 71, 72, the planes of the turns of which are perpendicular to the axis of 68. The length of 68 is substantially equal to half a free-space wavelength for frequency $f_2$, which is assumed to be only slightly different from frequency $f_1$.

The ferrite pieces 69 and 70 are mounted against each other with only a very small spacing, so as to form a closed magnetic circuit. The steady field $H_0$ is applied to the whole assembly in a direction parallel to axis $z$.

Windings 71 and 72 are series-connected and their terminals are respectively connected to conductors 73, 74, the first of which is connected at 75 to the wall of guide 67, which plays the part of constant potential conductor for the output circuit consisting of condenser 76 and resistor 77, also connected at 79 through conductor 78 to the wall of 67. Condenser 76, in combination with windings 71, 72, constitutes a resonant circuit tuned to the frequency $f_3$ of the frequency-changed signals transmitted to said output circuit by windings 71, 72.

In Fig. 5, condenser 76 has been represented in series-connection with the assembly of windings 71, 72. However, it could also be in parallel connection with them. In the latter case, conductor 74 would be directly connected to resistor 77. The choice of the more advantageous connection method depends on the respective values of the impedances of windings 71, 72 and resistor 77, which can be the input resistance of an amplifier. The proper mutual connection direction of 71 and 72 must be such that the opposite phase electromotive forces induced therein by the alternating magnetic fields parallel to the axis of 68 add themselves. This condition is necessary, as the magnetic field caused in 69 and 70 by the current in rod 68 induced by the current in rod 62 has an antisymmetrical configuration with respect to the median plane of 68 parallel to the narrower sides of guide 67, while the field $H_1$ of the signal wave has a symmetrical configuration with respect to this median plane.

In Fig. 5, it may also be noted that guide 67 is provided at 80 with a broadening partially separated from said guide by a conducting wall 81, while its breadth is, on the contrary, reduced, in its part facing rod 68, by the conducting members 82, 83. The purpose of this arrangement is to take due account of the fact that the phase velocities of the waves are not the same for the local oscillator wave and for the signal wave, as they respectively propagate according to different modes in the two-conductor transmission line consisting of rod 68 and the walls of 67, on one hand, and in guide 68, on the other hand. In fact, to obtain in the ferrite pieces 69, 70 the highest possible magnetic field intensity, for both local oscillator and signal waves, it is necessary that the middle point of the length of 68 be at a distance from wall 81 substantially equal to an integer number of half-wavelengths for both of said waves. To fulfill this condition, this distance is adjusted to an integer number of half-wavelengths of the above-mentioned two-conductor line, and guide 67 is artificially lengthened for the signal wave by means of broadening 80.

Of course, in the just-described embodiment, it must be understood that the coupling method shown in Fig. 5 between cavity 65 and guide 67 is not the only possible one. In Fig. 5, cavity 65 has been shown as consisting of the end of the input guide 67, but this cavity could, in view of a better matching, be coupled to said guide by any device known in wave guide technique.

It should also be mentioned that, in the case of Fig. 5 as well as in that of Figs. 2 to 4, it is possible to interchange the parts played by the oscillator and signal waves. For instance, in the case of Fig. 5, the signal wave could enter cavity 65 through guide 61, and the oscillator wave could be led to 65 through guide 67.

It must also be understood that the various above-mentioned embodiments of the invention are only given by way of example and that numerous variants of such embodiments may be built by means well-known to the man of the art.

The above-mentioned rule for proper selection of the relative values of frequencies $f_0$, $f_1$ and $f_2$, taking in account the amplitude $h_2$ of the local oscillator magnetic field, will be given now:

Both theory and experience show that the above-mentioned nutation motion presents a series of discrete natural frequencies of increasing values, at each one of which vibrations can be excited, for corresponding discrete and increasing power levels of the oscillator. The value $f_n$ of the lowest of these frequencies is approximately given by the relationship:

$$f_n^2=(f_2-f_0)^2+\frac{1}{4\pi^2}\gamma^2 h_2^2$$

To achieve maximum efficiency frequency-changing, when the input signal frequency $f_1$ and the output signal frequency $f_3$ are predetermined, the values of $f_0$ and $f_3$ must be selected in such a manner that $f_n$ be very close to $f_3$; other things being equal, this result should be obtained for the highest possible value of $h_2^2$, i.e. for the maximum possible power of the oscillator, as the power gain of the device increases with $h_2$. The available oscillator power being practically limited, the above-mentioned condition will be fulfilled by suitably adjusting $f_0$ (i.e. the value of $H_0$) and consequently $f_2$, which is equal to $(f_1 \pm f_3)$. Stability of operation of the device then requires that $H_0$ and $h_2$ be fairly constant.

It must also be noticed that the mentioned power gain exists only for the beat frequency $(f_1-f_2)$ between the oscillator and signal frequencies, not for the second beat frequency $(f_1+f_2)$, as there is no natural nutation frequency having the latter value.

What is claimed is:

1. An ultra-high frequency changing device comprising a plurality of bodies of magnetic material having gyromagnetic resonance at a frequency $f_0$ when polarized by a steady magnetic field $H_0$, means for applying said steady field $H_0$ to said bodies in a first given direction, first input circuit means submitted to a signal current of frequency $f_1$, means for deriving from said first circuit means a first alternating magnetic field of frequency $f_1$ and for applying it to at least one of said magnetic bodies in a second direction substantially perpendicular to said first direction, second circuit means for deriving from a local oscillator a second alternating magnetic field of frequency $f_2$ and for applying it to at least one of said magnetic bodies in a third direction substantially perpendicular to said first direction, an output circuit, and means for impressing the total resulting magnetic field in said first direction upon said output circuit so as to create therein an alternating electromotive force of frequency $f_3$ equal to $(f_1+f_2)$, said plurality of magnetic bodies being arranged in pairs in which the bodies are symmetrically arranged with respect to a plane parallel to said first direction, and wherein said means for applying said first and second alternating magnetic fields are positioned to produce for one of latter said fields a symmetrical configuration with respect to said plane and for the other of latter said field an antisymmetrical configuration with respect to said plane.

2. A device as claimed in claim 1, comprising a wave guide length, a short-circuit member terminating said length, said bodies being positioned in said wave guide length in the vicinity of said member, and wave guides applying said first and second alternating magnetic fields to said guide length and being positioned as to respectively produce for one of latter said fields a symmetrical configuration with respect to a symmetry plane of said guide length parallel to said first direction, and for the other of latter said fields an antisymmetrical configuration with respect to latter said plane, and wherein said means for impressing said total magnetic field in said first direction include a coupling conducting loop the plane of which is substantially perpendicular to said first direction.

3. A device as claimed in claim 1, wherein said first and second circuit means include a conducting rod set up in said guide length in a direction substantially parallel to said first direction and tuned to a frequency near the signal frequency $f_1$.

4. A device as claimed in claim 1, comprising a condenser in said output circuit and windings around said magnetic bodies, said condenser and windings constituting a resonant circuit tuned to the frequency $f_3$.

References Cited in the file of this patent

UNITED STATES PATENTS

| | | |
|---|---|---|
| 2,714,191 | Cayzac | July 26, 1955 |
| 2,728,050 | van de Lindt | Dec. 20, 1955 |
| 2,802,183 | Read | Aug. 6, 1957 |
| 2,873,370 | Pound | Feb. 10, 1959 |